(12) United States Patent
Park et al.

(10) Patent No.: US 8,973,230 B2
(45) Date of Patent: Mar. 10, 2015

(54) POLLING METHOD OF PIEZOELECTRIC ELEMENT AND METHOD OF MANUFACTURING INERTIAL SENSOR

(75) Inventors: Heung Woo Park, Gyunggi-do (KR); Seung Hun Han, Gyunggi-do (KR); Jung Won Lee, Seoul (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 887 days.

(21) Appl. No.: 13/178,162

(22) Filed: Jul. 7, 2011

(65) Prior Publication Data

US 2012/0159754 A1    Jun. 28, 2012

(30) Foreign Application Priority Data

Dec. 24, 2010   (KR) .......................... 10-2010-0134669

(51) Int. Cl.
*H04R 17/00*   (2006.01)
*H01L 41/257*  (2013.01)

(52) U.S. Cl.
CPC .................................. *H01L 41/257* (2013.01)
USPC ........... 29/25.35; 29/592.1; 29/595; 324/109; 324/658; 324/727; 310/321; 310/328; 310/330; 310/331

(58) Field of Classification Search
USPC .............. 29/25.35, 595; 324/76.49, 109, 658, 324/727; 310/321, 328, 330, 331, 33
See application file for complete search history.

(56) References Cited

U.S. PATENT DOCUMENTS

| 5,751,318 | A   | * | 5/1998 | Granzow ........................ 347/68 |
| 7,955,641 | B2  | * | 6/2011 | Schneider et al. ............ 427/100 |
| 2011/0162181 | A1 | * | 7/2011 | Kim et al. .................... 29/25.35 |

FOREIGN PATENT DOCUMENTS

JP       2004288943 A   *  10/2004

* cited by examiner

*Primary Examiner* — Paul D Kim
(74) *Attorney, Agent, or Firm* — Ladas & Parry, LLP

(57) ABSTRACT

Disclosed herein is a method of manufacturing an inertial sensor using a polling method of a piezoelectric element performing a polling after packaging the piezoelectric element, the method of manufacturing an inertial sensor including: forming a driving electrode and a sensing electrode on a flexible substrate on which a piezoelectric material is deposited; electrically connection the driving electrode and the sensing electrode; packaging the flexible substrate; polling by applying voltage and heat to the driving electrode and the sensing electrode; and electrically separating the driving electrode from the sensing electrode by applying heat to the driving electrode and the sensing electrode.

11 Claims, 3 Drawing Sheets

POLLING METHOD OF PIEZOELECTRIC ELEMENT AND METHOD OF MANUFACTURING INERTIAL SENSOR

CROSS REFERENCE TO RELATED APPLICATION

This application claims the benefit of Korean Patent Application No. 10-2010-0134669, filed on Dec. 24, 2010, entitled "Polling Method Of Piezoelectric Element And Method of Manufacturing Inertial Sensor Using The Same," which is hereby incorporated by reference in its entirety into this application.

BACKGROUND OF THE INVENTION

1. Technical Field

The present invention relates to a polling method of a piezoelectric element and a method of manufacturing an inertial sensor using the same.

2. Description of the Related Art

Recently, as a small, light inertial sensor is easily manufactured by using an MEMS technology, its application range has been expanded to home appliances over an existing market. As the function of the sensor is continuously developed, the inertial sensor has been developed from a uniaxial sensor capable of detecting an inertial force of a single axis using a single sensor to a multi-axis capable of detecting an inertial force of a multi-axis of at least two axes using a single sensor.

Meanwhile, the piezoelectric element has been variously used for various actuators, sensors, or the like, by being deformed when voltage is applied to the piezoelectric element and generating charges a when force is applied to the piezoelectric element from the outside. In addition, the piezoelectric element uses various materials such as Aln, ZnO, quartz, or the like. However, PZT having a piezoelectric constant has been mainly used in various applications.

In order to improve the characteristics of the piezoelectric element, most of the piezoelectric elements are subjected to a polling process before being operated after the piezoelectric element is manufactured. The polling process is to improve the piezoelectric characteristics by applying heat and voltage.

Meanwhile, as a method of implementing a low-price micro angular velocity sensor, a capacitive method and a piezoelectric method have been mainly used. Further, the piezoelectric method can implement an atmospheric pressure packaging without needing to implement a vacuum packaging, as compared to the capacitive method.

In more detail, FIG. 1 is a schematic configuration diagram of an inertial sensor according to the prior art. As shown in FIG. 1, the inertial sensor 100 is configured to include a sensor unit 110, an ASIC chip 120, a molding unit 130, a wire 140, and a lead frame 150.

The sensor unit 110 is configured to include a driving body 111, a flexible substrate part 112 on which a driving electrode and a detection electrode are formed, a support body 113, an upper cap 114, and a lower cap 115.

By the above configuration, the driving body 111 is driven up and down, left and right/front and back or a complex direction thereof by applying voltage to the driving electrode. As a method for packaging an element in a micro size at low cost, a QFN or an LGA package has been mainly used. The package method is a method of performing an EMC molding process, mounting an element on a lead frame, and filling the entire surrounding of the element with epoxy. There is a need to protect the driving body 111 during the EMC molding. To this end, there is a need for a structure protecting the driving body 111 from an EMC epoxy or an external environment.

However, the piezoelectric element may deteriorate the polling characteristics while being subjected to a high-temperature packaging process by polling an individual chip and packaging it in the state of the substrate state before being packaged. In serious cases, the entire polling is released.

Therefore, it is most preferable to perform the polling after the element is packaged. In this case, as shown in FIG. 2, a terminal 112c is formed as many as the number of driving electrodes 112b and detection electrodes 112a to be polled. All the terminals should each be led and the electrode pads are required more than needs since the voltage and heat should be applied thereto. As a result, there are problems in that the size of the element is increased and the number of unused terminals is increased.

SUMMARY OF THE INVENTION

The present invention has been made in an effort to provide a polling method of a piezoelectric element performing a polling after packaging the piezoelectric element by alternately a connection part made of a conductive material and a soldering part between electrodes in series, performing a soldering, electrically separating the electrodes by applying heat at which the solder of the soldering part reflow, and then packaging the piezoelectric element, and a method of manufacturing an inertial sensor using the same.

According to a preferred embodiment of the present invention, there is provided a polling method of a piezoelectric element, including: forming a plurality of electrodes on a substrate on which a piezoelectric material is deposited; electrically connecting the plurality of electrodes; packaging the substrate; polling by applying voltage and heat to the plurality of electrodes; and separating the plurality of electrodes by applying heat to the plurality of electrodes.

The connecting of the driving electrode and the sensing electrode may alternately connect a connection part made of a conductive material and a soldering part between the respective electrodes in series and the electrically separating of the driving electrode from the sensing electrode may apply heat reflowing the solder of the soldering part.

The soldering part may include a metal part and a solder part and when at the electrically separating of the driving electrode from the sensing electrode, heat may be applied to the soldering part, the solder may reflow and may be collected in the metal part and is separated from the connection part.

According to another preferred embodiment of the present invention, there is provided a method of manufacturing an inertial sensor, including: forming a driving electrode and a sensing electrode on a flexible substrate on which a piezoelectric material is deposited; electrically connection the driving electrode and the sensing electrode; packaging the flexible substrate; polling by applying voltage and heat to electrically connect the driving electrode with the sensing electrode; and electrically separating the driving electrode from the sensing electrode by applying heat to the driving electrode and the sensing electrode.

The connecting of the driving electrode and the sensing electrode may alternately connect a connection part made of a conductive material and a soldering part between the respective electrodes in series.

The connecting of the driving electrode and the sensing electrode may alternately connect a connection part made of a conductive material and a soldering part between the respective electrodes in series, and the electrically separating of the driving electrode from the sensing electrode may apply heat reflowing the solder of the soldering part.

The soldering part may include a metal part and a solder part and when at the electrically separating of the driving electrode from the sensing electrode, heat may be applied to the soldering part, the solder may reflow and may be collected in the metal part and is separated from the connection part.

The connection part may be made of platinum (Pt) and the metal part of the soldering part may be made of under bump material metal such as gold (Au).

The connecting of the driving electrode and the sensing electrode may alternately connect a connection part made of a conductive material and a soldering part between the respective electrodes in series and the packaging may be performed at a temperature at which the solder of the soldering part is not melted.

The forming of the driving electrode and the sensing electrode on the flexible substrate on which the piezoelectric material is deposited may further include: preparing the flexible substrate as a silicon or a silicon on insulator (SOI) substrate; depositing a piezoelectric material on the flexible substrate; depositing the electrodes on the upper portion of the piezoelectric material; forming vias on the electrodes and forming a driving electrode pattern and a sensing electrode pattern; and forming a driving mass on the lower portion of the flexible substrate.

The method of manufacturing an inertial sensor may further include prior to the packaging of the flexible substrate, coupling the upper cap and the lower cap on the upper and lower portions of the flexible substrate.

DESCRIPTION OF THE PREFERRED EMBODIMENTS

Figure 1:
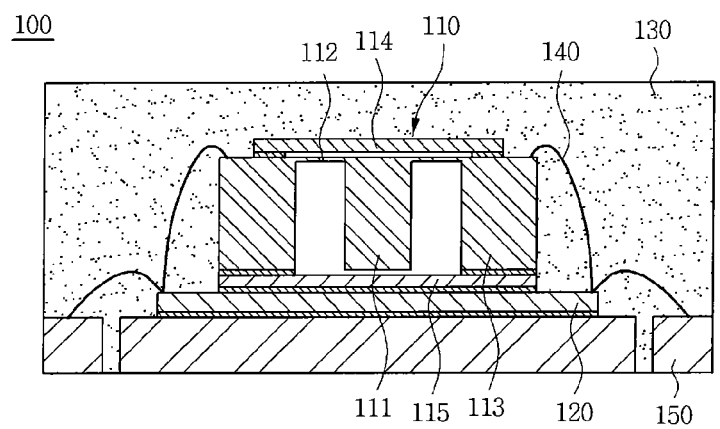
FIG. 1 is a schematic configuration diagram of an inertial sensor according to the prior art.
Figure 2:
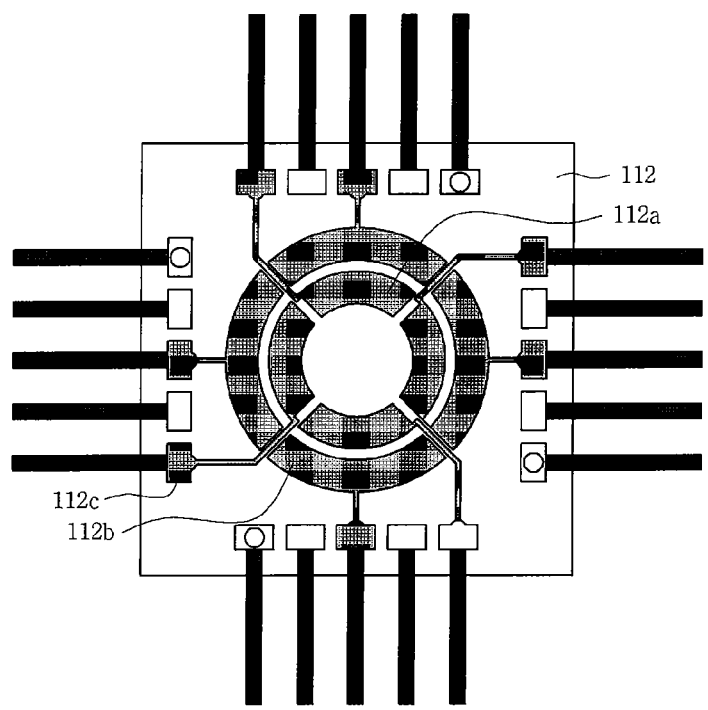
FIG. 2 is a process state diagram schematically showing a method of packaging a piezoelectric element according to the prior art.

Various objects, advantages and features of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

The above and other objects, features and advantages of the present invention will be more clearly understood from the following detailed description taken in conjunction with the accompanying drawings. In the specification, in adding reference numerals to components throughout the drawings, it is to be noted that like reference numerals designate like components even though components are shown in different drawings. Further, when it is determined that the detailed description of the known art related to the present invention may obscure the gist of the present invention, the detailed description thereof will be omitted.

A polling method for a piezoelectric element according to the present invention performs a polling after packaging the piezoelectric element. To this end, a plurality of electrodes are formed on a substrate on which a piezoelectric element is deposited, the plurality of electrodes are electrically connected, the substrate is packaged, the polling is performed by applying voltage and heat to the plurality of electrodes, and the plurality of electrodes are separated by applying heat to the plurality of electrodes.

In addition, in order to electrically separate each electrode by applying heat, a method of connecting the driving electrode with the sensing electrode alternately connects a connection part and a metal part made of a conductive material and a soldering part including a solder part between the respective electrodes in series, collects a solder in the metal part by reflowing the solder when heat is applied to the soldering part, and separates the solder from the connection part.

Hereinafter, a method of manufacturing an inertial sensor using a polling method of a piezoelectric element according to preferred embodiments of the present invention will be described in detail with reference to the accompanying drawings.

Figure 3:
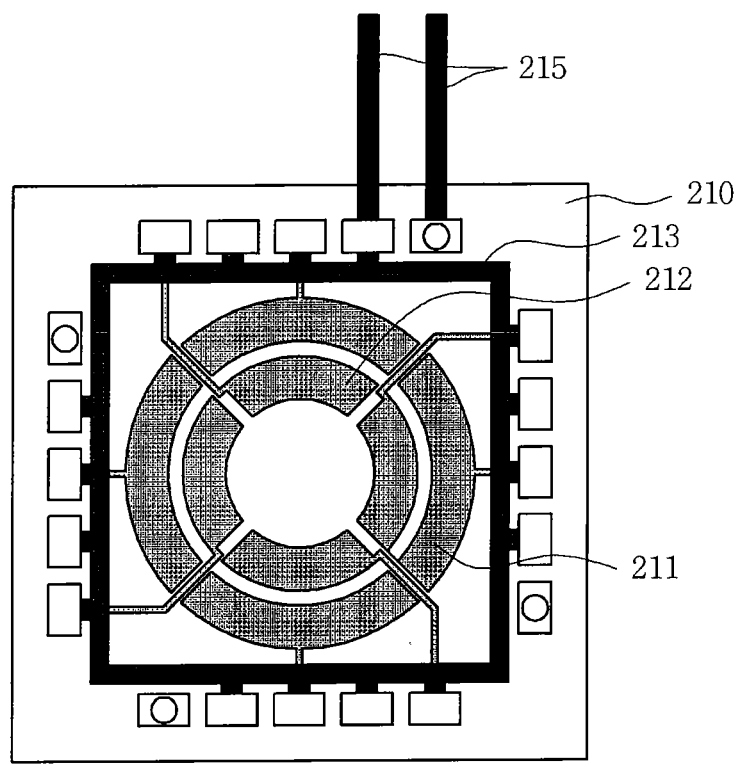
FIG. 3 is a process state diagram schematically showing a state in which electrodes are connected, in a method of manufacturing an inertial sensor using the polling method of a piezoelectric element according to the present invention.
Figure 4:
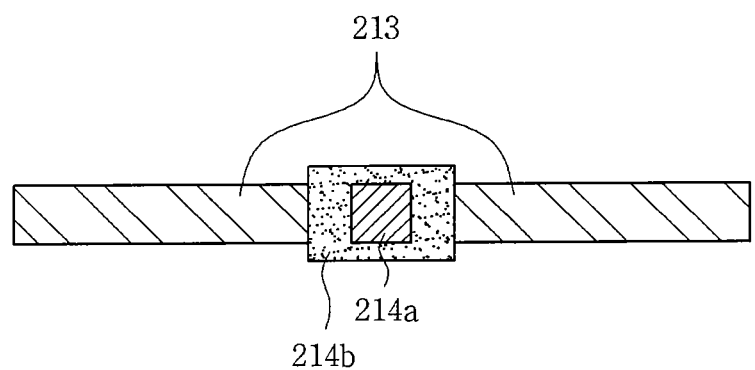
FIG. 4 is a partially state diagram schematically showing a connection part shown in FIG. 3.

FIG. 3 is a process state diagram schematically showing a state in which electrodes are connected, in a method of manufacturing an inertial sensor using the polling method of a piezoelectric element according to the present invention and FIG. 4 is a partially state diagram schematically showing a connection part shown in FIG. 3. As shown, a flexible substrate 210 on which a piezoelectric material is deposited is formed with a driving electrode 211 and a sensing electrode 212. The driving electrode 211 is electrically connected to the sensing electrode 212. In this case, as shown in FIG. 4, a connection part 213 that is a connection wiring made of a conductive material to electrically connect each electrode is alternately connected to a soldering part 214.

In addition, the soldering part 214 is configured to include a metal part 214a and a solder part 214b.

That is, the metal part 214a is disposed at an intermediate portion of the connection wiring by limiting a wettable metal portion and the solder is deposited over the metal part 214a and the connection part 213 by adjacently disposing the connection wiring.

The connection part 213 may be made of platinum (Pt) and the metal part 214a of the soldering part 214 may be made of under bump material metal such as gold (Au).

Further, in order to implement the polling after the packaging process, each connection line 215 extends to the outside from the package area in a pair of terminals.

Figure 5:
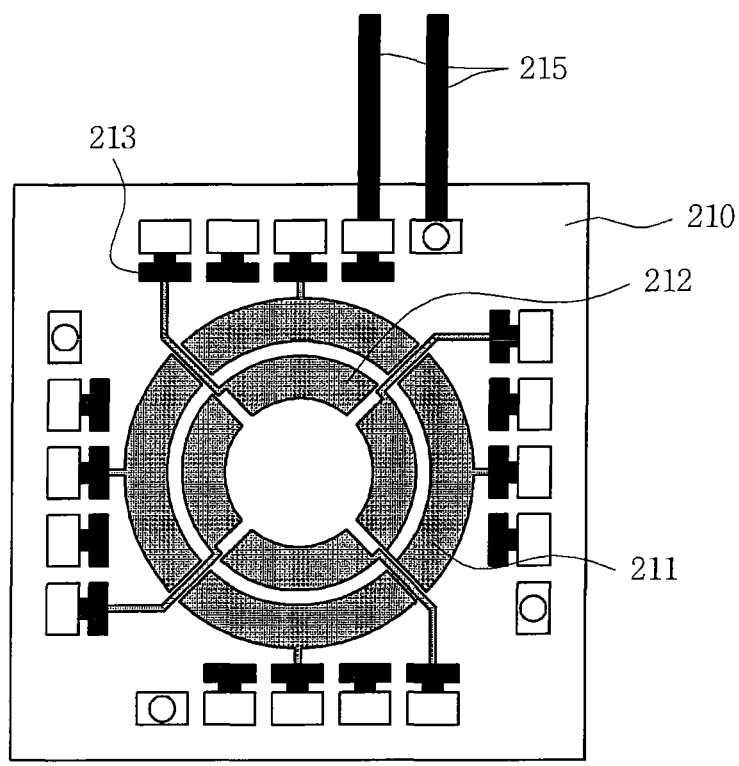
FIG. 5 is a process state diagram schematically showing a state in which electrodes are separated, in a method of manufacturing an inertial sensor using the polling method of a piezoelectric element according to the present invention.
Figure 6:
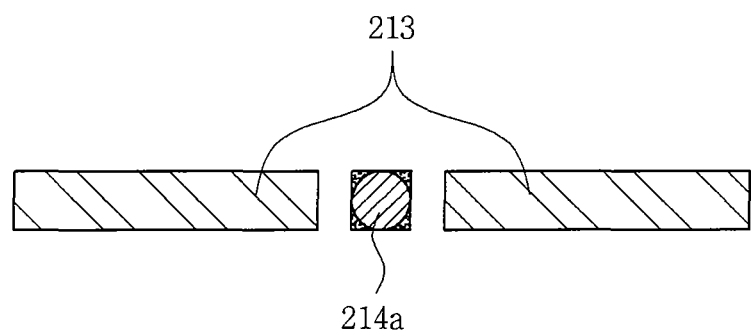
FIG. 6 is a partially state diagram schematically showing a connection part shown in FIG. 5.

FIG. 5 is a process state diagram schematically showing a state in which electrodes are separated, in a method of manufacturing an inertial sensor using the polling method of a piezoelectric element according to the present invention and FIG. 6 is a partially state diagram schematically showing a separated connection part shown in FIG. 5. As shown, the packaging of the flexible substrate is performed at temperature where the solder of the soldering part is not melted. The driving electrode and the sensing electrode are polled by applying voltage and heat to the connection part 215 and the driving electrode is electrically separated from the sensing electrode by applying heat to the solder part 214b. In more detail, as shown in FIG. 6, when high-temperature heat at which the solder of the solder part 214b reflows is applied, the solder reflows and are collected in the metal part 214a to separate the soldering part 214 from the connection part 213 and electrically separate the adjacent connection parts 213, such that the upper electrode and the lower electrode, i.e., the piezoelectric element can be normally operated.

In addition, in order for the polling method of the piezoelectric element according to the present invention to apply to the method of manufacturing an inertial sensor, in more detail, in order to form the driving electrode and the sensing electrode on the flexible substrate on which the piezoelectric material is deposited, the flexible substrate is prepared as silicon or an silicon on insulator substrate, the piezoelectric material is deposited on the flexible substrate, the electrodes are deposited on the upper portion of the piezoelectric material, the vias are formed in the electrode, and the driving electrode and sensing electrode patterns are formed. A driving mass is formed on the lower portion of the flexible substrate.

In addition, the method of manufacturing an inertial sensor according to the present invention couples the upper cap and the lower cap on the upper portion and the lower portion in order to protect the electrode and the driving mass of the flexible substrate before the flexible substrate is packaged.

As set forth above, the preferred embodiment of the present invention can provide the polling method of a piezoelectric element performing the polling after packaging the piezoelectric element by alternately the connection part made of a conductive material and the soldering part between the electrodes in series, performing the soldering, electrically separating the electrodes by applying heat in order to reflow the solder of the soldering part, and then packaging the piezoelectric element, and the method of manufacturing an inertial sensor using the same.

Although the preferred embodiments of the present invention have been disclosed for illustrative purposes, they are for specifically explaining the present invention and thus the polling method of a piezoelectric element and the method of manufacturing an inertial sensor using the same according to the present invention are not limited thereto, but those skilled in the art will appreciate that various modifications, additions and substitutions are possible, without departing from the scope and spirit of the invention as disclosed in the accompanying claims.

Accordingly, such modifications, additions and substitutions should also be understood to fall within the scope of the present invention.

What is claimed is:

1. A polling method of a piezoelectric element, comprising:
    forming a plurality of electrodes on a substrate on which a piezoelectric material is deposited;
    electrically connecting the plurality of electrodes;
    packaging the substrate;
    polling by applying voltage and heat for polling to the plurality of electrodes; and
    separating the plurality of electrodes by applying heat for separating to the plurality of electrodes.

2. The polling method of a piezoelectric element as set forth in claim 1, wherein the connecting of the plurality of electrodes alternately connects a connection part made of a conductive material and a soldering part between the respective electrodes in series, and
    the separating of the plurality of electrodes applies the heat for separating reflowing a solder of the soldering part.

3. The polling method of a piezoelectric element as set forth in claim 2, wherein the soldering part includes a metal part and a solder part, and
    when at the separating of the plurality of electrodes, the heat for separating is applied to the soldering part, the solder reflows and is collected in the metal part and is separated from the connection part.

4. A method of manufacturing an inertial sensor, comprising:
    forming a driving electrode and a sensing electrode on a flexible substrate on which a piezoelectric material is deposited;
    electrically connecting the driving electrode and the sensing electrode;
    packaging the flexible substrate;
    polling by applying voltage and heat for polling to the driving electrode and the sensing electrode; and
    electrically separating the driving electrode from the sensing electrode by applying heat for separating to the driving electrode and the sensing electrode.

5. The method of manufacturing an inertial sensor of claim 4, wherein the connecting of the driving electrode and the sensing electrode alternately connects a connection part made of a conductive material and a soldering part between the respective electrodes in series.

6. The method of manufacturing an inertial sensor of claim 4, wherein the connecting of the driving electrode and the sensing electrode alternately connects a connection part made of a conductive material and a soldering part between the respective electrodes in series, and
    the electrically separating of the driving electrode from the sensing electrode applies the heat for separating reflowing a solder of the soldering part.

7. The method of manufacturing an inertial sensor of claim 6, wherein the soldering part includes a metal part and a solder part, and
    when at the electrically separating of the driving electrode from the sensing electrode, the heat for separating is applied to the soldering part, the solder reflows and is collected in the metal part and is separated from the connection part.

8. The method of manufacturing an inertial sensor of claim 7, wherein the connection part is made of platinum (Pt) and the metal part of the soldering part is made of gold (Au).

9. The method of manufacturing an inertial sensor of claim 4, wherein the connecting of the driving electrode and the sensing electrode alternately connects a connection part made of a conductive material and a soldering part between the respective electrodes in series, and
    the packaging is performed at a temperature at which a solder of the soldering part is not melted.

10. The method of manufacturing an inertial sensor of claim 4, wherein the forming of the driving electrode and the sensing electrode on the flexible substrate on which the piezoelectric material is deposited further includes:
    preparing the flexible substrate as a silicon or a silicon on insulator (SOI) substrate;
    depositing the piezoelectric material on the flexible substrate;
    depositing the driving electrode and the sensing electrode on the upper portion of the piezoelectric material;
    forming vias on the driving electrode and the sensing electrode and forming a driving electrode pattern and a sensing electrode pattern, and forming a driving mass on a lower portion of the flexible substrate.

11. The method of manufacturing an inertial sensor of claim 4, further comprising prior to the packaging of the flexible substrate, coupling the upper cap and the lower cap on the upper and lower portions of the flexible substrate.

* * * * *